United States Patent
Choi et al.

(10) Patent No.: US 9,955,567 B2
(45) Date of Patent: Apr. 24, 2018

(54) CROSSTALK REDUCTION BETWEEN SIGNAL LAYERS IN A MULTILAYERED PACKAGE BY VARIABLE-WIDTH MESH PLANE STRUCTURES

(71) Applicant: INTERNATIONAL BUSINESS MACHINES CORPORATION, Armonk, NY (US)

(72) Inventors: Jinwoo Choi, Austin, TX (US); Sungjun Chun, Austin, TX (US); Jason L. Frankel, Hopewell Junction, NY (US); Paul R. Walling, Austin, TX (US); Roger D. Weekly, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 647 days.

(21) Appl. No.: 14/341,834

(22) Filed: Jul. 27, 2014

(65) Prior Publication Data

US 2014/0331482 A1    Nov. 13, 2014

Related U.S. Application Data

(62) Division of application No. 12/952,152, filed on Nov. 22, 2010, now Pat. No. 8,927,879.

(51) Int. Cl.
*H05K 1/02* (2006.01)
*G06F 17/50* (2006.01)
*H05K 1/11* (2006.01)

(52) U.S. Cl.
CPC ....... *H05K 1/0224* (2013.01); *G06F 17/5081* (2013.01); *H05K 1/116* (2013.01);
(Continued)

(58) Field of Classification Search
CPC ............. G06F 17/5068; G06F 17/5077; G06F 17/5081; H05K 1/0224; Y10T 29/49155
See application file for complete search history.

(56) References Cited

U.S. PATENT DOCUMENTS 4,781,968 A    11/1988 Kellerman
4,855,537 A    8/1989  Nakai
(Continued)

FOREIGN PATENT DOCUMENTS

JP    03-158002 A    7/1991

OTHER PUBLICATIONS

Ramaraju, Ravindraraj, "A Tapered Power Grid Design and Optimization Method", Motorola Technical Disclosure, IPCOM000011626D, 2003, 6 pages.
(Continued)

*Primary Examiner* — Livius R Cazan
(74) *Attorney, Agent, or Firm* — Amy J. Pattillo; Joseph Petrokaitis

(57) ABSTRACT

A computer system receives an initial multilayered ceramic package design. The computer system maintains a first selection of mesh line segments of the mesh line segments at a first width and adjusts a second selection of mesh line segments of the plurality of mesh line segments to a second width. The computer system controls fabrication of the multilayered ceramic package based on the modified multilayered ceramic package design.

10 Claims, 6 Drawing Sheets

(52) U.S. Cl.
CPC .............. *H05K 2201/09681* (2013.01); *H05K 2201/09718* (2013.01); *H05K 2201/09727* (2013.01); *Y10T 29/49004* (2015.01); *Y10T 29/49155* (2015.01); *Y10T 29/53022* (2015.01)

(56) References Cited

U.S. PATENT DOCUMENTS

| | | | |
|---|---|---|---|
| 5,012,047 | A | 4/1991 | Dohya |
| 5,334,800 | A | 8/1994 | Kenney |
| 5,338,970 | A | 8/1994 | Boyle et al. |
| 5,446,243 | A | 8/1995 | Crowder et al. |
| 5,519,176 | A | 5/1996 | Goodman et al. |
| 5,596,506 | A | 1/1997 | Petschauer et al. |
| 5,675,299 | A | 10/1997 | Suski |
| 5,723,908 | A | 3/1998 | Fuchida et al. |
| 5,736,784 | A | 4/1998 | Dove |
| 5,812,380 | A | 9/1998 | Frech et al. |
| 5,818,315 | A | 10/1998 | Moongilan |
| 6,150,895 | A | 11/2000 | Steigerwald |
| 6,184,477 | B1 | 2/2001 | Tanahashi |
| 6,255,600 | B1 | 7/2001 | Schaper |
| 6,297,460 | B1 | 10/2001 | Schaper |
| 6,388,200 | B2 | 5/2002 | Schaper |
| 6,442,041 | B2 | 8/2002 | Rehm |
| 6,483,714 | B1 | 11/2002 | Kabumoto |
| 6,510,545 | B1 | 1/2003 | Yee |
| 6,617,243 | B1 | 9/2003 | Weekly |
| 6,657,130 | B2 | 12/2003 | Van Dyke et al. |
| 6,769,108 | B2 | 7/2004 | Weekly |
| 6,885,098 | B2 | 4/2005 | Weekly |
| 7,017,139 | B2 | 3/2006 | Weekly |
| 7,088,000 | B2 | 8/2006 | Cranmer et al. |
| 7,265,438 | B2 | 9/2007 | Tsai |
| 7,348,667 | B2 | 3/2008 | Chun et al. |
| 7,371,450 | B2 | 5/2008 | Arakawa |
| 7,411,134 | B1 | 8/2008 | Steinfeld |
| 7,430,800 | B2 | 10/2008 | Haridass et al. |
| 7,646,082 | B2 | 1/2010 | Chun et al. |
| 7,784,010 | B1 | 8/2010 | Balsdon et al. |
| 8,288,657 | B2 | 10/2012 | Choi et al. |
| 8,624,297 | B2 | 1/2014 | Chun et al. |
| 8,645,889 | B2 | 2/2014 | Choi et al. |
| 2001/0010270 | A1 | 8/2001 | Lin et al. |
| 2001/0013422 | A1 | 8/2001 | Schaper |
| 2001/0046125 | A1 | 11/2001 | Rehm et al. |
| 2002/0168798 | A1 | 11/2002 | Glenn et al. |
| 2003/0071343 | A1 | 4/2003 | Buffet et al. |
| 2003/0177466 | A1 | 9/2003 | Weekly |
| 2004/0145033 | A1 | 7/2004 | McElvain |
| 2004/0172608 | A1 | 9/2004 | Weekly |
| 2005/0028130 | A1 | 2/2005 | Bartley et al. |
| 2005/0055660 | A1 | 3/2005 | Donaldson et al. |
| 2005/0140019 | A1 | 6/2005 | Watanabe |
| 2005/0244609 | A1 | 11/2005 | Arakawa et al. |
| 2006/0214190 | A1 | 9/2006 | Chun et al. |
| 2006/0272851 | A1 | 12/2006 | Haridass et al. |
| 2007/0187468 | A1 | 8/2007 | Douriet et al. |
| 2008/0087457 | A1 | 4/2008 | Haridass et al. |
| 2008/0092101 | A1 | 4/2008 | Haridass et al. |
| 2008/0156523 | A1 | 7/2008 | Saito |
| 2008/0230259 | A1 | 9/2008 | Booth, Jr. et al. |
| 2008/0290474 | A1 | 11/2008 | Chun et al. |
| 2010/0035426 | A1 | 2/2010 | Chun et al. |
| 2011/0061898 | A1* | 3/2011 | Mutnury ............ G06F 17/5036 174/250 |
| 2011/0083888 | A1 | 4/2011 | Choi et al. |
| 2011/0088931 | A1 | 4/2011 | Lettow et al. |
| 2011/0132650 | A1 | 6/2011 | Becker et al. |
| 2012/0125677 | A1 | 5/2012 | Choi et al. |
| 2012/0204141 | A1 | 8/2012 | Choi et al. |
| 2013/0133937 | A1 | 5/2013 | Choi et al. |
| 2013/0252379 | A1 | 9/2013 | Becker et al. |
| 2014/0080300 | A1 | 3/2014 | Chun et al. |

OTHER PUBLICATIONS

Unno, Yoshinobu, "High-density low-mass hybrid and associated technologies", High Energy Accelerator Research Organization, Japan, 2000, 11 pages.

Harrer, H., et al, "First- and second-level packaging for the IBM eServer Z900", IBM J. Res. and Dev., vol. 46, No. 4/5, Jul./Sep. 2002, pp. 397-420, 24 pages.

Iqbal, Asif, "Design Tradeoffs Among MCM-C, MCM-D and MCM-D/C Technologies", IEEE Transactions on Components, Packaging, and Manufacturing Technology, Part B: Advanced Packaging, vol. 17, No. 1, Feb. 1994, pp. 22-29, 8 pages.

"Punch-operation and die optimization for ceramic-module production", IBM Research, 2 pages, accessed on Sep. 29, 2010 from http://domino.research.ibm.com/comm/research.nsf/pages/r.algorithms.innovation.htnnl.

Non-final Office Action, dated Nov. 27, 2013, U.S. Appl. No. 12/952,152, filed Nov. 22, 2010, In re Choi, 26 pages.

Notice of Allowance, dated Jun. 19, 2014, U.S. Appl. No. 12/952,152, filed Nov. 22, 2010, In re Choi, 24 pages.

Election, dated Oct. 7, 2013, U.S. Appl. No. 12/952,152, filed Nov. 22, 2010, In re Choi, 6 pages.

Notice of Allowance, dated Sep. 3, 2014, U.S. Appl. No. 12/952,152, filed Nov. 22, 2010, In re Choi, 29 pages.

\* cited by examiner

CROSSTALK REDUCTION BETWEEN SIGNAL LAYERS IN A MULTILAYERED PACKAGE BY VARIABLE-WIDTH MESH PLANE STRUCTURES

CROSS REFERENCE TO RELATED APPLICATIONS

This application is a divisional of commonly assigned U.S. patent application Ser. No. 12/952,152, filed Nov. 22, 2010, now U.S. Pat. No. 8,927,879, which is hereby incorporated herein by reference.

BACKGROUND

1. Technical Field

The invention relates generally to an improved apparatus and method for crosstalk reduction in a multilayered package and more specifically, the invention is directed to an apparatus and method for crosstalk reduction in multilayered ceramic packages using variable-width mesh structures.

2. Description of Related Art

Multilayer modules are used for the packaging of electronic components, and in particular, for packaging integrated circuit chips. Both single chip modules (SCM) and multi chip modules (MCM) are widely used. One common type of chip module is the multilayer ceramic packaging module. In a multilayer ceramic packaging module, multiple layers consist of ceramic or glass-ceramic material, for example.

In one example, a multilayer ceramic fabrication process involves the formation of green or unfired ceramic layers or sheets, the formation of conductive paste, the screening of the conductive paste onto the green ceramic sheets and the stacking, laminating, and firing of the ceramic sheets into the final multilayer ceramic structure. During the fabrication process, via holes are selectively punched in working blank sheets, then the via holes are eventually filled with a conductive composition to allow for electrical connections from layer to layer in the multilayer ceramics structure.

In one example, multilayer ceramic modules incorporate signal planes and mesh power delivery planes, also referred to as mesh planes, by designing the wiring layers in a multilayer ceramic package in a stacked triplicate configuration with signal wiring sandwiched between upper and lower mesh planes, with all lines on each mesh plane of the same voltage domain or ground. These mesh planes include structures meshed in a regular grid structure and corresponding with the vias in such a manner to allow via interconnections for the signal lines in the signal plane and the power lines in the mesh planes.

Depending on the thickness of green ceramic sheets, a metal loading requirement is set that caps the maximum amount of metal that can be placed on a green ceramic sheet in the conductive composition, and thus limits the widths of the mesh lines laid on each mesh layer. In addition, with vias establishing electrical connections between layers, if a mesh line runs too close to a via, yield detracting shorts may be introduced which compromise the performance of the module, therefore via clearances set the minimum distance between any via and any mesh line.

With increased signal rising and falling edge rates and bus signaling speeds, signals on the signal plane may interact with other signals on other signal planes above and below it through the mesh planes. These interactions between signals on different signal layers, also referred to as crosstalk, introduce interference that limits signaling rates and performance and at certain thresholds, will compromise the integrity of received data.

BRIEF SUMMARY

In view of the foregoing, there is a need for an apparatus and method that reduces crosstalk between signal layers in a multilayered ceramic package. In addition, there is a need for such an apparatus and method that reduces crosstalk between signal layers while also balancing signal integrity needs and manufacturing limitations.

In another embodiment, a system of fabricating a multilayered ceramic package comprises at least one computer system operative to receive an initial multilayered ceramic package design, wherein the initial multilayered ceramic package design comprises a plurality of signal layers, each signal layer having one or more signal lines, at least one mesh layer adjacent at least one signal layer of the plurality of signal layers, wherein the at least one mesh layer comprises a mesh of a plurality of interconnected mesh line segments referenced by connection to either voltage or ground, wherein each of the plurality of mesh line segments are set to a same width, and at least one via running through the at least one signal layer and the at least one reference mesh layer, wherein each of the plurality of mesh line segments is positioned at least a via clearance minimum distance from the at least one via, a selection of signal lines from among the one or more signal lines positioned in relation to other signal layers from among the plurality of signal layers to cause crosstalk. The system comprises the at least one computer system operative to maintain a first selection of mesh line segments of the plurality of mesh line segments at a first width and adjust a second selection of mesh line segments of the plurality of mesh line segments to a second width, wherein the second width is greater than the first width, wherein the second selection of mesh line segments of the second width are positioned to shadow a first portion of the selection of signal lines to contain crosstalk introduced by the first portion of the selection of signal lines, wherein each of the plurality of mesh line segments is positioned at least the via clearance minimum distance for the at least one via, wherein each of the second selection of mesh line segments is widened to the second width wider than the first width on both sides of first selection of mesh line segments maintained at the first width, wherein none of the second selection of mesh line segments is adjacent to the at least one via, to generate a modified multilayered ceramic package design with mesh wiring of varying widths. The system comprises the at least one computer system operative to remove at least one mesh line segment from among the first selection of mesh line segments in the initial multilayered ceramic package design, to generate the modified multilayered ceramic package design with mesh wiring of varying widths and at least one less mesh line segment than specified in the initial multilayered ceramic package design, to reduce the total metal fill for the plurality of mesh line segments to meet metal loading requirements for fabricating the at least one mesh layer. The system comprises the at least one computer system operative to control fabrication of the multilayered ceramic package based on the modified multilayered ceramic package design.

In another embodiment, a computer program product for fabricating a multilayered ceramic package comprises a computer readable storage medium having program instructions embodied therewith. The program instructions are executable by a computer to cause the computer to receive an initial multilayered ceramic package design, wherein the initial multilayered ceramic package design comprises a plurality of signal layers, each signal layer having one or more signal lines, at least one mesh layer adjacent at least one signal layer of the plurality of signal layers, wherein the at least one mesh layer comprises a mesh of a plurality of interconnected mesh line segments referenced by connection to either voltage or ground, wherein each of the plurality of mesh line segments are set to a same width, and at least one via running through the at least one signal layer and the at least one reference mesh layer, wherein each of the plurality of mesh line segments is positioned at least a via clearance minimum distance from the at least one via, a selection of signal lines from among the one or more signal lines positioned in relation to other signal layers from among the plurality of signal layers to cause crosstalk. The program instructions are executable by a computer to cause the computer to maintain a first selection of mesh line segments of the plurality of mesh line segments at a first width and adjust a second selection of mesh line segments of the plurality of mesh line segments to a second width, wherein the second width is greater than the first width, wherein the second selection of mesh line segments of the second width are positioned to shadow a first portion of the selection of signal lines to contain crosstalk introduced by the first portion of the selection of signal lines, wherein each of the plurality of mesh line segments is positioned at least the via clearance minimum distance for the at least one via, wherein each of the second selection of mesh line segments is widened to the second width wider than the first width on both sides of first selection of mesh line segments maintained at the first width, wherein none of the second selection of mesh line segments is adjacent to the at least one via, to generate a modified multilayered ceramic package design with mesh wiring of varying widths. The program instructions are executable by a computer to cause the computer to remove at least one mesh line segment from among the first selection of mesh line segments in the initial multilayered ceramic package design, to generate the modified multilayered ceramic package design with mesh wiring of varying widths and at least one less mesh line segment than specified in the initial multilayered ceramic package design, to reduce the total metal fill for the plurality of mesh line segments to meet metal loading requirements for fabricating the at least one mesh layer. The program instructions are executable by a computer to cause the computer to fabricate the multilayered ceramic package based on the modified multilayered ceramic package design.

BRIEF DESCRIPTION OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art that the present invention may execute in a variety of systems, including a variety of computer systems and electronic devices operating any number of different types of operating systems.

Figure 1:
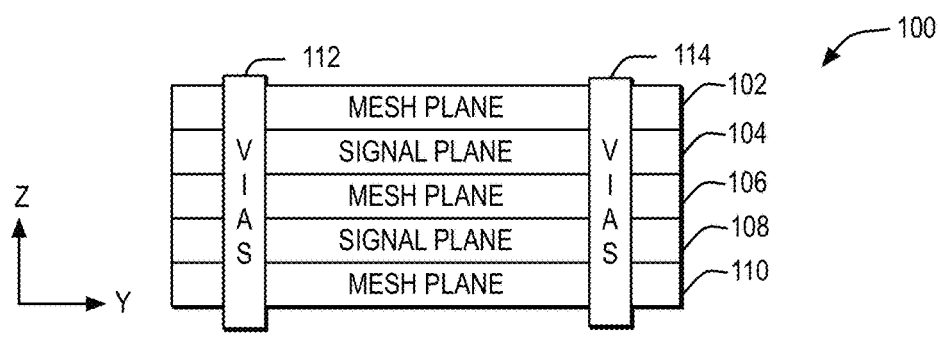
FIG. 1 illustrates a side view of examples of layers of a multilayer ceramic (MLC) package with multiple mesh planes, signal planes, and vias interconnecting the planes.

FIG. 1 illustrates a side view of examples of layers of a multilayer ceramic (MLC) package with multiple mesh planes, signal planes, and vias interconnecting the planes. In the example, an MLC package 100 is composed of signal planes 104 and 108 sandwiched between power delivery mesh planes 102, 106, and 110. Signal planes 104 and 108 are formed by signal lines formed in ceramic substrate. Mesh planes 102, 106, and 110 are formed of ceramic layers with metal wire mesh formed thereon. Vertical vias 112 and 114 are vertical conductive structures that tie into one or more mesh planes.

In one example, mesh planes 102 and 110 provide ground (GND) lines and mesh plane 106 provides voltage (VDD) lines, which each plane set to a same voltage or ground. In one example, the GND lines of mesh planes 102 and 110 are accessed by vertical via 112, which ties into mesh planes 102 and 110, and the VDD lines of mesh plane 106 are accessed by vertical via 114, which ties into mesh plane 106. It will be understood that additional signal planes, mesh planes and vertical vias may be provided in MLC package 100.

Based on the position of signal lines within signal planes 104 and 108, the signals introduced by adjacent signal lines may be inductively coupled to one another, giving rise to noise in the signals due to crosstalk interference. In particular, as signal rising and falling edge rates and bus signaling speeds increase, signals on signal lines on signal plane 104 may interact with signals on other signal lines on the same signal plane 104 and on other signal planes 108 through mesh planes 102, 106, and 110. The cross talk interaction between high speed signals introduces noise and intersymbol interference (ISI) on the nets that severely limits the maximum signaling rates and performance on these nets. In order to be able to achieve higher signaling rates and performance, it is necessary to minimize the crosstalk related noise in the signal lines of signal planes 104 and 108.

In the embodiment, the vertical crosstalk interference experienced by signals in signal lines in one signal plane due to signals in signal lines in other signal planes is minimized through the placement of the mesh lines forming metal wire mesh within mesh planes 102, 106, and 110. The wider a mesh line segment that shadows a signal line, the more likely the return current associated with the signal on that signal line will flow in the mesh line segment, thereby increasing the likelihood of containing the electromagnetic fields associated with the signal such that crosstalk to signals on other signal lines is minimized.

Mesh planes 102, 106, and 110 include variable width mesh line segments with wider segments positioned to shadow adjacent signal lines in signal planes 104 and 108, while maintaining via clearance requirements and metal loading limits for each ceramic layer. In particular, in widening mesh line segments, to maintain via clearance requirements and avoid introducing yield detracting shorts resulting from mesh line segments running too close to vias, mesh line segments adjacent to vias may not be widened or may be widened only on the side of the mesh line segment opposite the via. In addition, because widening mesh line segments increases the total load of metal required, to maintain metal loading limits for each ceramic layer, widths selected for the variable width mesh line segments, coarseness of wiring, and the number of wiring segments in a mesh wire structure for a mesh plane may be adjusted to reduce the total metal loading required for the metal wire mesh of a mesh plane to maintain metal loading requirements.

Figure 2:
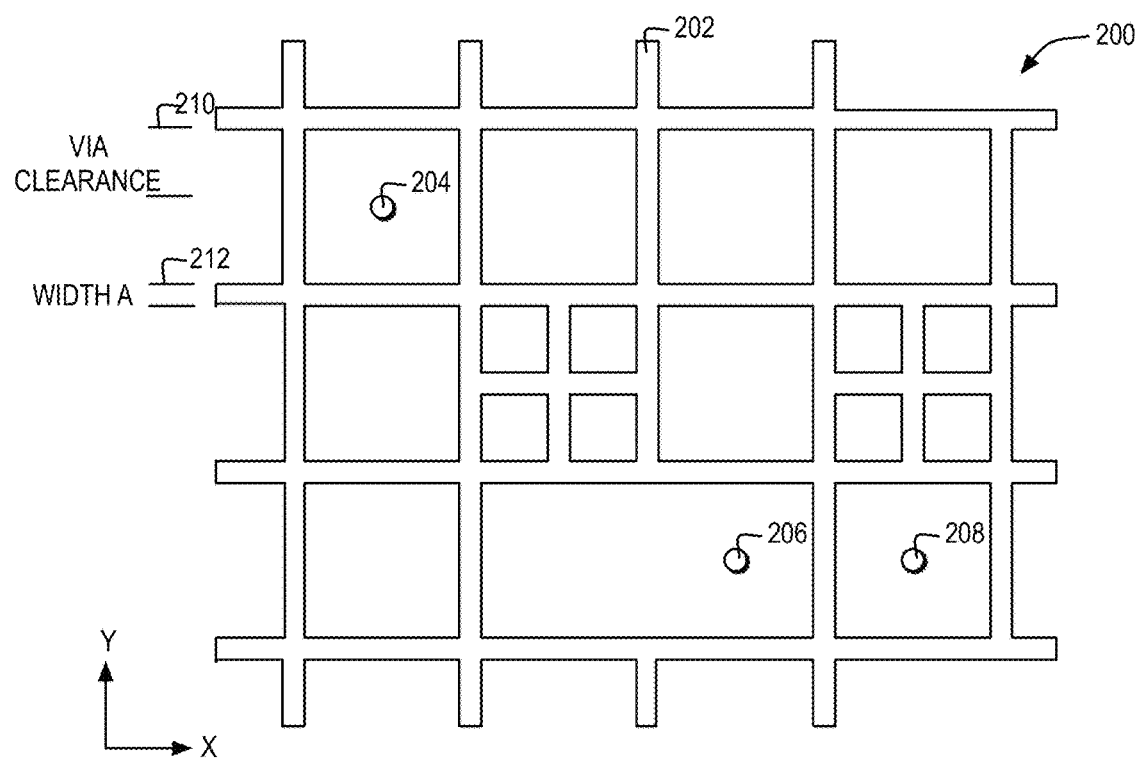
FIG. 2 illustrates a top view of an example of a mesh plane with multiple mesh lines of a same width and set apart from each via by a distance of at least the via clearance requirement.

FIG. 2 illustrates a top view of an example of a mesh plane with multiple mesh lines of a same width and set apart from each via by a distance of at least the via clearance requirement. In the example, vias 204, 206, and 208 are tied to a mesh plane 200, which may represent any of mesh planes 102, 106, and 110. Multiple wires are laid horizontally and vertically throughout mesh plane 200 to form a metal wire mesh 202, as illustrated.

The horizontal and vertical wires composing metal wire mesh 202 are all of a same width A 212 and of a same pitch. For example, the wires forming metal wire mesh 202 may be 61 micrometer (um) wide and on a 371.2 um pitch.

In addition, the horizontal and vertical wires forming metal wire mesh 202 are laid with a clearance around each of vias 204, 206, and 208 of at least the distance set for via clearance 210. For example, the wires forming metal wire mesh 202 are laid with a clearance from via to mesh line of 120 um, with vias 71 um in diameter, to meet via clearance ground rule minimums and avoid yield shorts. Although not depicted, vias may vary in diameter and thus via clearances may vary by via.

Further, the horizontal and vertical wires forming metal wire mesh 202 are set at a width and pitch to meet metal loading requirements. For example, the wires forming metal wire mesh 202 are laid with a width and pitch such that the total green sheet metal fill on mesh layer 200 is 29% loading, which is less than the maximum manufacturing ground rule limit of 30% loading.

Figure 3:
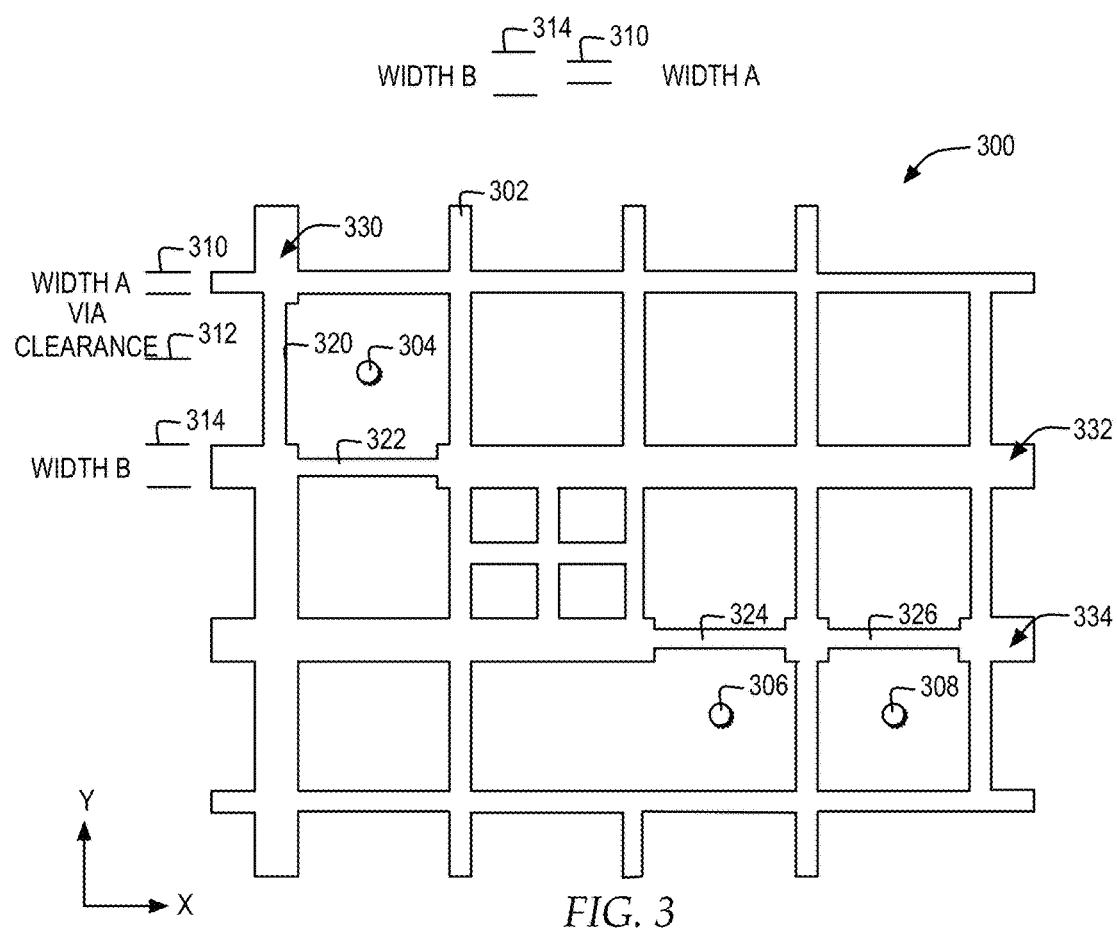
FIG. 3 depicts a top view of an example of a mesh plane with multiple mesh lines of with line segments of varying widths and set apart from each via by a distance of at least a via clearance requirement.

FIG. 3 depicts a top view of an example of a mesh plane with multiple mesh lines of with line segments of varying widths and set apart from each via by a distance of at least a via clearance requirement. In the example, vias 304, 306, and 308 are tied to a mesh plane 300, which may represent any of mesh planes 102, 106, and 110. Multiple wires are laid horizontally and vertically through mesh plane 300 to form a metal wire mesh 302, as illustrated.

FIG. 3 illustrates the horizontal and vertical wires composing metal wire mesh 302, in a similar layout as metal wire mesh 202 in FIG. 2, all with the same pitch, but with mesh line segments of varied widths. In particular, in the example, a first selection of mesh line segments are laid with a first width A 310 and a second selection of mesh line segments are laid with a second width B 314. As illustrated, width B 314 is wider than width A 310. In one example, width A 310 is set to the same nominal base width implemented in metal wire mesh 202 of 61 um and width B 314 is set to a wider width of 65 um.

Although there are mesh line segments of first width A 310 and second width B 314 laid in mesh layer 300, all the wires forming metal wire mesh 302 are laid with a clearance around each of vias 304, 306, and 308 of at least the distance set for via clearance 312. For example, the wires forming metal wire mesh 302 are laid such that any line segment adjacent to any of vias 304, 306, and 308 is of a first width A 310 and is a distance from each of vias 304, 306, and 308 of at least the distance set for via clearance 312, such as the via clearance of 120 um for vias 71 um in diameter, as described in FIG. 2.

As illustrated, vertical wire 330 is set to width B 314, except for mesh line segment 320, which is set to width A 310 and which is laid adjacent to via 304, but set a distance from via 304 of at least the distance set for via clearance 312. In addition, as illustrated, horizontal wire 332 is set to width B 314, except for mesh line segment 322, which is set to width A 310 and which is laid adjacent to via 304, but set a distance from via 304 of at least the distance set for via clearance 312. In addition, as illustrated, horizontal wire 334 is set to width B 314, except for mesh line segments 324 and 326, which are set to width A 310 and which are laid adjacent to vias 306 and 308, respectively, but are set a distance from vias 306 and 308 of at least the distance set for via clearance 312.

Although not depicted, the mesh line segments within metal wire mesh 302 set to a width of width B 314 are parallel to signal lines in a signal plane, such that by widening a selection of mesh line segments which shadow signal lines, the likelihood that the return current associated with the signals on these shadowed signal lines will flow in the mesh line segment increases, thereby increasing the likelihood of containing the electromagnetic fields associated with the signals such that crosstalk to signals on other signal lines is reduced.

In setting the mesh line segment width for width B 314 and in selecting the number of mesh line segments to lay at width B 314, the width and number are limited by the maximum manufacturing ground rule limit for metal loading, such as 30% loading. In selecting the width and number of mesh line segments to be set at width B 314 are selected, adjustments may be made to the remaining segments of metal wire mesh 302 to meet the maximum manufacturing ground rule limit for metal loading. In one example, once the number of mesh line segments which if increased to width B 314 will minimize crosstalk are identified, and the width required for width B 314 to effectively minimize crosstalk is set, the nominal mesh width set for width A 310 is decreased in order to still meet the maximum manufacturing ground rule limit for metal loading for metal wire mesh 302. In another example, once the number of mesh line segments which if increased to width B 314 will minimize crosstalk are identified, and the width required for width B 314 to effectively minimize crosstalk is set, the coarseness of the mesh lines is increased to reduce meet the maximum manufacturing ground rule limit for metal loading. Additionally, only a selection of the remaining line segments of metal wire mesh 302 not set to width B 314 may be removed or made coarser in areas which would not effect signal integrity or power delivery to reduce metal fill usage and meet the maximum manufacturing ground rule limit for metal loading for metal wire mesh 302.

Figure 4:
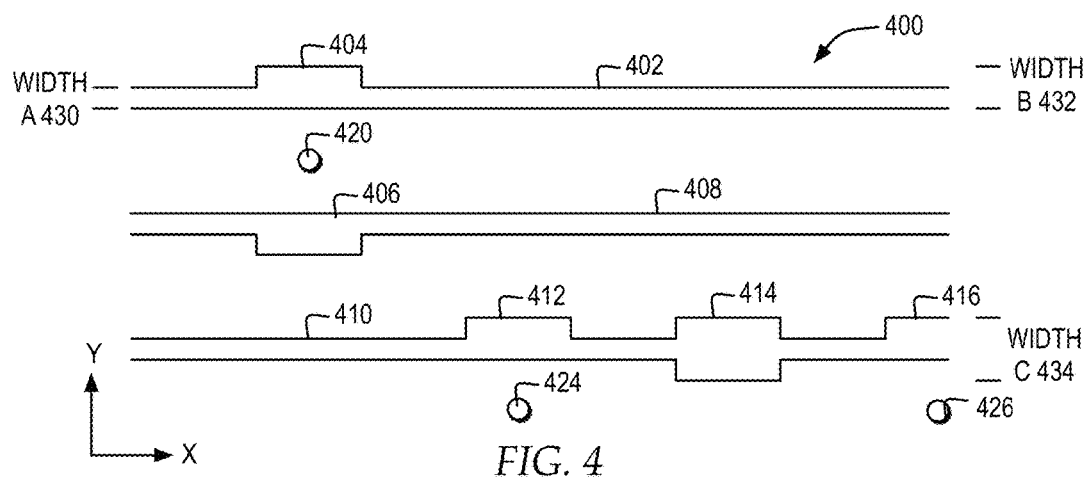
FIG. 4 illustrates a top view of an example of a mesh plane with multiple mesh lines of varying widths widened either on one side or both sides of a mesh wire segment.

FIG. 4 illustrates a top view of an example of a mesh plane with multiple mesh lines of varying widths widened either on one side or both sides of a mesh wire segment. In the example, vias 420, 424, and 426 are tied to a mesh plane 400, which may represent any of mesh planes 102, 106, and 110. Multiple wires are laid horizontally through mesh plane 400.

FIG. 4 illustrates variable segment width mesh wires of three widths illustrated as width A 430, width B 432, and width C 434. In the example, width A 430 represents the nominal base mesh line segment width, width B 432 represents the base mesh line segment increased on one side of the line segment, and width C 434 represents the widest mesh line segment width, with width increases on both sides of the line segment.

In the example, the mesh line segments of a mesh wire 402 are set to the nominal base mesh line segment width of width A 430, with the exception of a line segment 404, which is increased in width on the side of opposite via 420 and set to width B 432. In addition, in the example, the mesh line segments of a mesh wire 408 are set to the nominal base line segment width of width A 430, with the exception of a mesh line segment 406, which is increased in width on the side of opposite via 420 and set to width B 432. As illustrated, mesh line segments 404 and 406 are adjacent to via 420, however the width of these mesh line segments is increased on the side opposite from via 420 so that the distance between mesh line segments 404 and 406 and via 420 is still at a distance of at least the distance set for the via clearance.

In addition, in the example, the mesh line segments of a mesh wire 410 are set to the nominal base line segment width of width A 430, with the exception of mesh line segments 412, 414, and 416. Mesh line segments 412 and 416 are increased in width on the side opposite vias 424 and 426 and set to width B 432. Mesh line segment 414 is increased in width on both sides and set to width C 434, which is set at a width which still allows mesh line segment 414 to be set a distance from vias 424 and 426 of at least the distance set for the via clearance.

Although not depicted, the diameters of vias may vary and via clearances may vary by via, such that to maintain via clearances when widening mesh line segments, additional widths of mesh line segments and additional mesh line segments may be introduced to meet the varying via clearances. In addition, although not depicted, the widths or other characteristics of signal lines may vary on a signal plane, such that to adjust mesh line segments to widths sufficient to contain crosstalk, additional widths of mesh line segments and additional mesh line segments may be introduced to contain the crosstalk.

Figure 5:
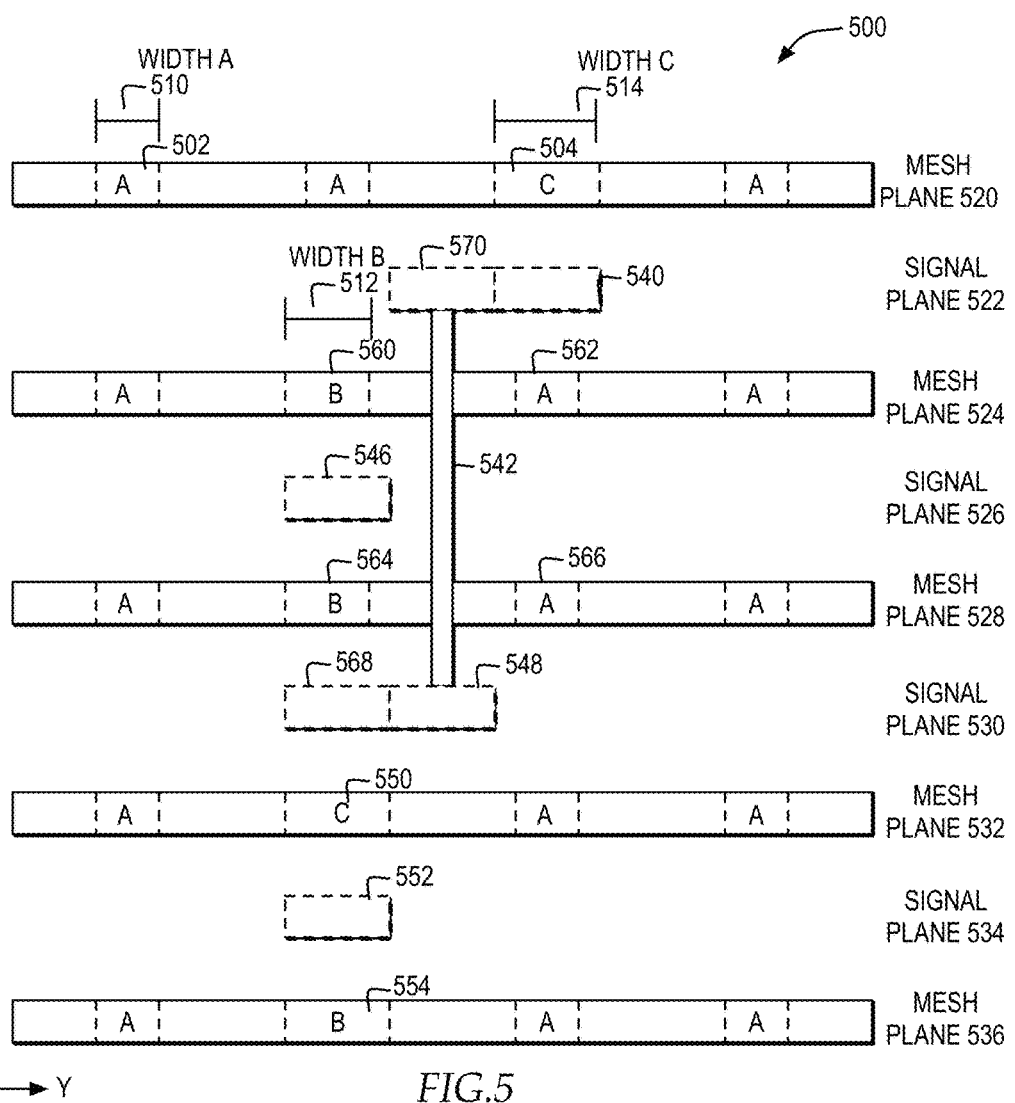
FIG. 5 illustrates a side view of examples of layers of an MLC package with multiple mesh lines of varying widths.

FIG. 5 illustrates a side view of examples of layers of an MLC package with multiple mesh lines of varying widths. In the example, signal planes 522, 530, and 534 are sandwiched between mesh planes 520, 524, 528, 532, and 536, as illustrated.

Each of mesh planes 520, 524, 528, 532, and 536 include multiple mesh wires, such as mesh line segments 502 and 504 in mesh plane 520. In addition, each signal plane may include one or more signal lines, such as signal lines 540, 546, 548, 552, 568, and 570. A via 542 runs from signal line 570 in signal plane 522 to signal line 548 in signal plane 530.

The mesh line segments illustrated in mesh planes 520, 524, 528, 532, and 536 are illustrated as set to one of three widths from among a width A 510, a width B 512, and width C 514. For example, a mesh line segment 502 is illustrated at a width of width A 510, as illustrated by the "A", a mesh line segment 560 is illustrated at a width of width B 512, as illustrated by the "B", and a mesh line segment 504 is illustrated at a width of width C 514, as illustrated by the "C". Width A 510 is the nominal base mesh line segment width, width B 512 is wider than width A 510, and width C 514 is wider than width B 512.

In the example, mesh line segment 504 shadows signal line 540, but is not adjacent to via 542, therefore mesh line segment 504 is set to the widest setting of width C 514. Mesh line segment 550 shadows signals 568 and 552, but is not adjacent to via 542, therefore mesh line segment 550 is also set to the widest setting of width C 514. In addition, mesh line segment 554 shadows signal 552, but is not adjacent to via 542, therefore mesh line segment 554 is set to the widest setting of width C 514.

In addition, in the example, mesh line segments 560 and 564 shadow signal line 546, and mesh line segment 564 also shadows signal line 568, however, mesh line segments 560 and 564 are adjacent to via 542. To maintain via clearance requirements, but still increase the width of mesh line segments 560 and 564 to reduce crosstalk from signals on signal line 546, mesh line segments 560 and 564 are set to width B 512, which increases the width of the mesh line segment on the side opposite via 542.

In addition, in the example, mesh line segment 562 shadows signal line 540, however the width of mesh line segment 562 is set to width A 510. In widening a selection of mesh line segments shadowing signal lines, not all mesh line segments shadowing signal lines are required to be widened.

Figure 6:
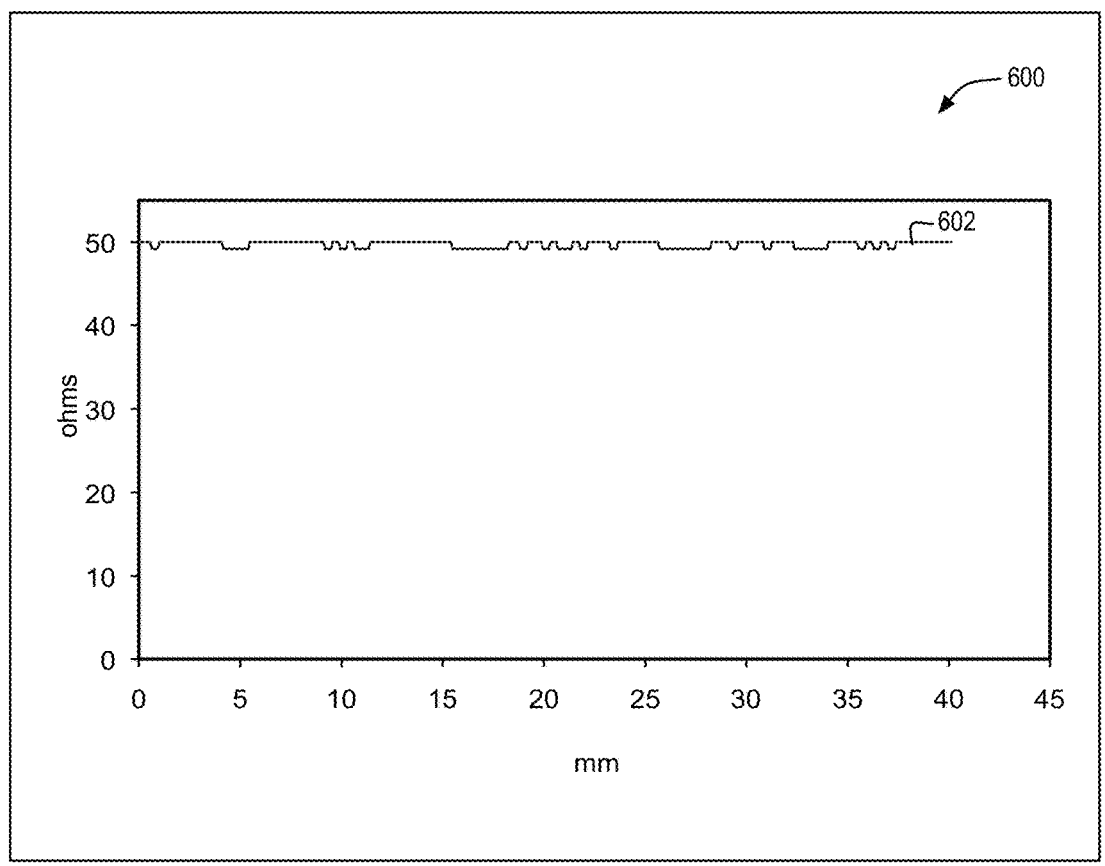
FIG. 6 illustrates a graph illustrating the characteristic impedance of the signal trace path due to the serrated nature of mesh line paths with segments of varying widths.

FIG. 6 illustrates a graph illustrating the characteristic impedance of the signal trace path due to the serrated nature of mesh line paths with segments of varying widths. As illustrated in FIGS. 3 and 4, by increasing the width of a selection of line segments along a mesh wire laid in a mesh plane, the path of the mesh wire may become serrated as the width varies between the nominal base line width and one or more wider segment widths. These serrations in mesh wire due to widening portions of the wire affect the characteristic impedance of signal trace paths within signal lines shadowed by the mesh wire. Graph 600 of FIG. 6 illustrates the undulation in characteristic impedance of signal trace paths shadowed by a mesh line path with segments of varying widths, where line 602 represents the undulation in characteristic impedance. As illustrated the undulations in line 602 are a small fraction of the absolute characteristic impedance and the undulation periods are short relative to the frequencies of the signals propagated up to several gigabits (Gbit) per second. Therefore, the small characteristic impedance magnitude variations illustrated in line 602 will be averaged and will not significantly affect the performance of the link.

In particular, the example of undulations represented in line 602 in FIG. 6 illustrates an undulation between 50.02 ohms and 49.2 ohms. The undulations are the result of measuring the impedance from signal trace paths of a signal shadowed by a mesh wire with a first selection of mesh line segments set to a first width of 61 um, producing the impedance of 50.02 ohms, and a second selection of mesh line segments interposed between the first selection of mesh line segments, and set to a second width of 65 um, producing the impedance of 49.2 ohms.

Although not depicted in graph 600, the maximum near end noise and absolute far end noise of the signal trace path may also be measured. For example, for signal trace path reflected in FIG. 6, the signal trace paths over the 61 um width mesh line segments yield a maximum near end noise of 10.94 mV and maximum absolute far end noise of 28.32 mV and the signal trace paths over the 65 um width mesh line segments yields maximum near end noise of 9.8 mV and maximum absolute far end noise of 17.7 mV. Thus, there is an improvement in the signal trace path in near end noise metrics of 10% due to the widened line segments shadowing the signal line and in far end noise metrics of 38% due to the widened line segments shadowing the signal line.

Figure 7:
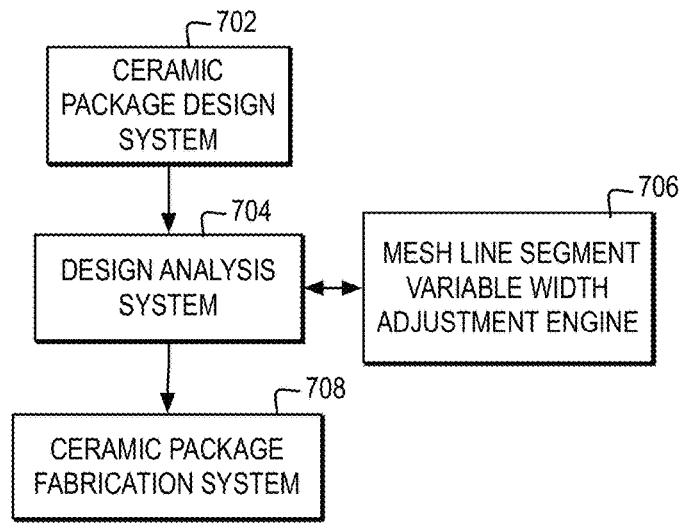
FIG. 7 depicts a block diagram of a system for generating a multilayered ceramic package.

FIG. 7 depicts a block diagram of a system for generating a multilayered ceramic package. As illustrated in FIG. 7, the system includes a ceramic package design system 702 coupled to a design analysis system 704. Also coupled to design analysis system 704 is mesh line segment variable width adjustment engine 706 and a ceramic package fabrication system 708. The ceramic package design system 702 provides a design for the multilayered ceramic package identifying the placement of signal lines, voltage, and ground reference mesh layers, and voltage and ground vias. Design analysis system 704 analyzes the design produced by ceramic package design system 702, which interfaces with mesh line segment variable width adjustment engine 706 to identify a selection of signal lines, which are likely to produce crosstalk, to identify a selection of mesh line segments that shadow the selection of signal lines, to identify portions of the mesh line segments that may be widened and the widths available to maintain via clearances with the widening of the mesh line segments, and to reduce the weight of the portions of the mesh wires set to the base mesh line segment width if necessary for the total mesh wire weight to meet metal loading requirements. Ceramic package fabrication system 708 fabricates the modified ceramic package design with mesh wires of varying widths.

Figure 8:
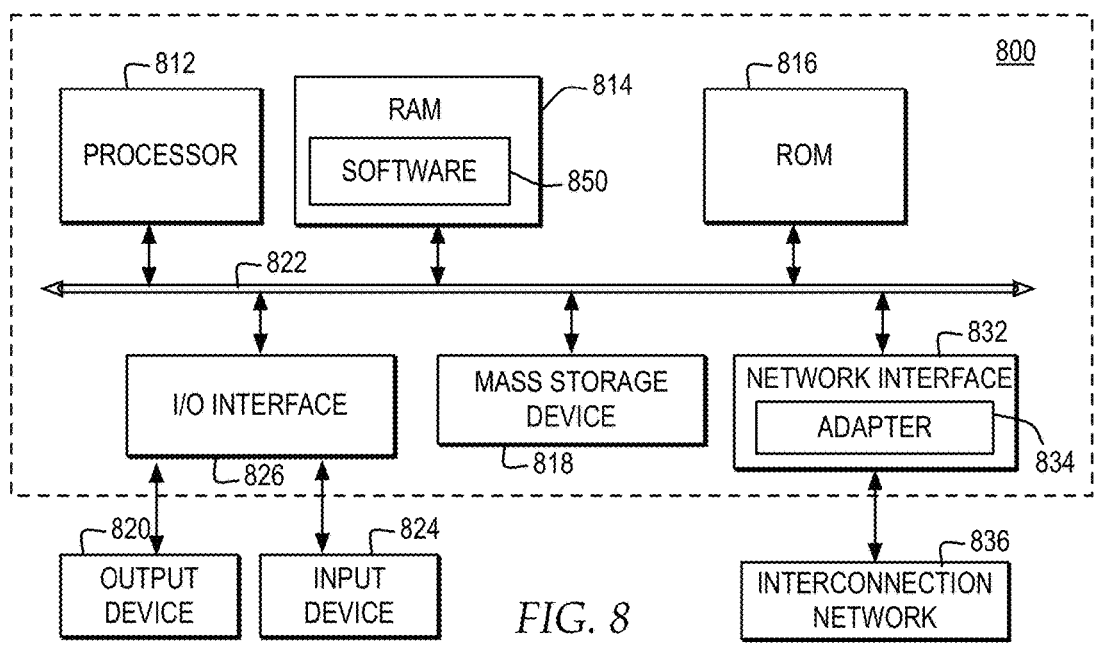
FIG. 8 illustrates one example of a computer system in which the system of FIG. 7 may be implemented and the process and program of FIG. 9 may be performed.
Figure 9:
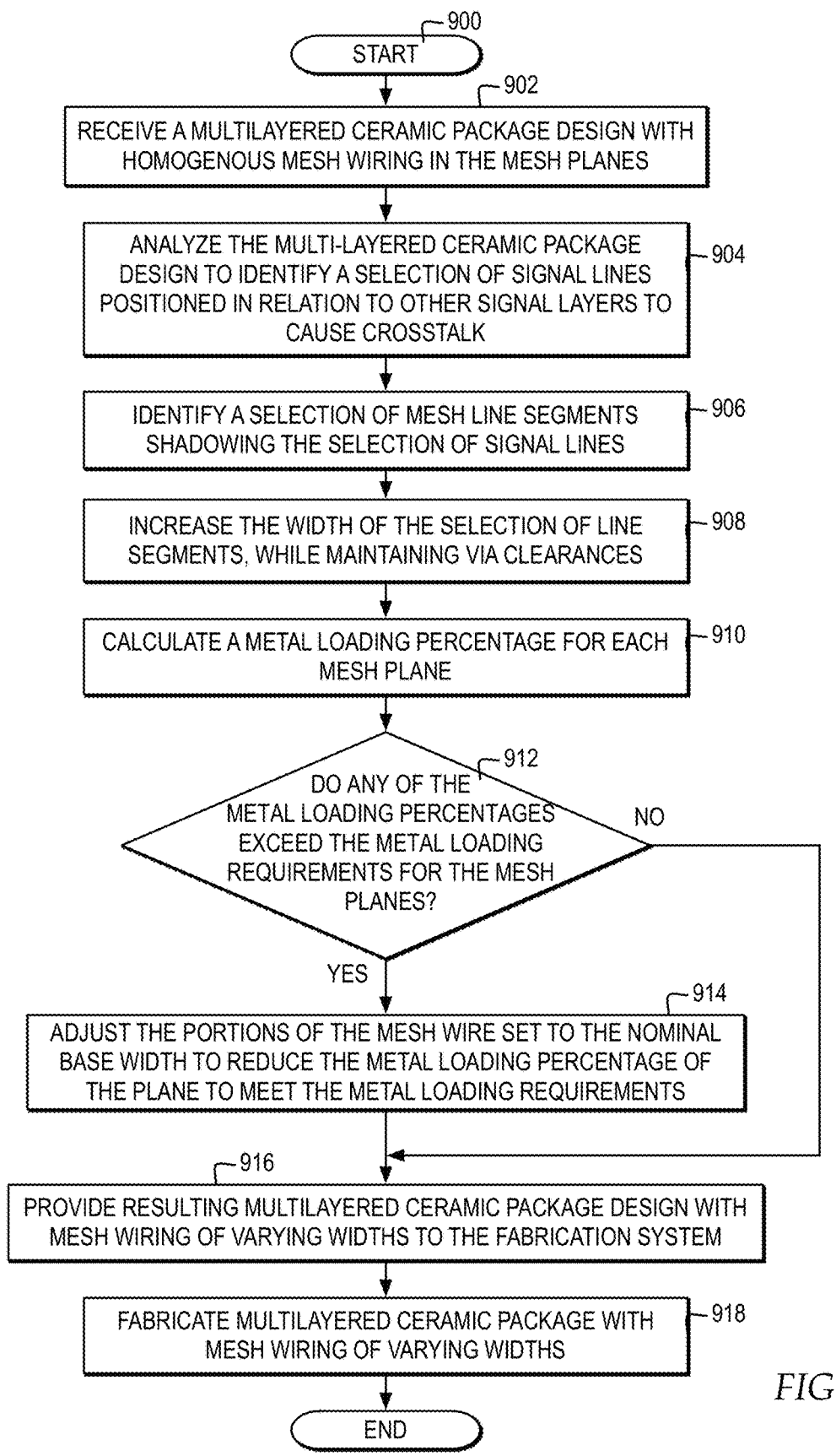
FIG. 9 depicts a high level logic flowchart of a process and program for designing variable width mesh wire widths in a multilayer ceramic module.

FIG. 8 illustrates one example of a computer system in which the system of FIG. 7 may be implemented and the process and program of FIG. 9 may be performed. The present invention may be performed in a variety of systems and combinations of systems, made up of functional components, such as the functional components described with reference to computer system 800 and may be communicatively connected to a network, such interconnection network 836.

Computer system 800 includes a bus 822 or other communication device for communicating information within computer system 800, and at least one hardware processing device, such as processor 812, coupled to bus 822 for processing information. Bus 822 preferably includes low-latency and higher latency paths that are connected by bridges and adapters and controlled within computer system 800 by multiple bus controllers. When implemented as a server or node, computer system 800 may include multiple processors designed to improve network servicing power. Where multiple processors share bus 822, additional controllers (not depicted) for managing bus access and locks may be implemented.

Processor 812 may be at least one general-purpose processor such as IBM's PowerPC (PowerPC is a registered trademark of International Business Machines Corporation) processor that, during normal operation, processes data under the control of software 850, which may include at least one of application software, an operating system, middleware, and other code and computer executable programs accessible from a dynamic storage device such as random access memory (RAM) 814, a static storage device such as Read Only Memory (ROM) 816, a data storage device, such as mass storage device 818, or other data storage medium. Software 850 may include, but is not limited to, code, applications, protocols, interfaces, and processes for controlling one or more systems within a network including, but not limited to, an adapter, a switch, a cluster system, and a grid environment.

In one embodiment, the operations performed by processor 812 may control the operations of flowchart of FIG. 9 and other operations described herein. Operations performed by processor 812 may be requested by software 850 or other code or the steps of one embodiment of the invention might be performed by specific hardware components that contain hardwired logic for performing the steps, or by any combination of programmed computer components and custom hardware components.

Those of ordinary skill in the art will appreciate that aspects of one embodiment of the invention may be embodied as a system, method or computer program product. Accordingly, aspects of one embodiment of the invention may take the form of an entirely hardware embodiment, an entirely software embodiment (including firmware, resident software, micro-code, etc.) or an embodiment containing software and hardware aspects that may all generally be referred to herein as "circuit," "module," or "system." Furthermore, aspects of one embodiment of the invention may take the form of a computer program product embodied in one or more tangible computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, such as mass storage device 818, a random access memory (RAM), such as RAM 814, a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction executing system, apparatus, or device.

A computer readable signal medium may include a propagated data signal with the computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction executable system, apparatus, or device.

Program code embodied on a computer readable medium may be transmitted using any appropriate medium, including but not limited to, wireless, wireline, optical fiber cable, radio frequency (RF), etc., or any suitable combination of the foregoing.

Computer program code for carrying out operations of on embodiment of the invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, such as computer system 800, partly on the user's computer, as a stand-alone software package, partly on the user's computer and partly on a remote computer or entirely on the remote computer or server. In the latter scenario, the remote computer may be connected to the user's computer through any type of network, such as interconnection network 836, through a communication interface, such as network interface 832, over a network link that may be connected, for example, to interconnection network 836.

In the example, network interface 832 includes an adapter 834 for connecting computer system 800 to interconnection network 836 through a link. Although not depicted, network interface 832 may include additional software, such as device drivers, additional hardware and other controllers that enable communication. When implemented as a server, computer system 800 may include multiple communication interfaces accessible via multiple peripheral component interconnect (PCI) bus bridges connected to an input/output controller, for example. In this manner, computer system 800 allows connections to multiple clients via multiple separate ports and each port may also support multiple connections to multiple clients.

One embodiment of the invention is described below with reference to flowchart illustrations and/or block diagrams of methods, apparatus (systems) and computer program products according to embodiments of the invention. Those of ordinary skill in the art will appreciate that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, such as computer system 800, or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer, such as computer system 800, or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Network interface 832, the network link to interconnection network 836, and interconnection network 836 may use electrical, electromagnetic, or optical signals that carry digital data streams. The signals through the various networks and the signals on interconnection network 836, the network link to interconnection network 836, and network interface 832 which carry the digital data to and from computer system 800, may be forms of carrier waves transporting the information.

In addition, computer system 800 may include multiple peripheral components that facilitate input and output. These peripheral components are connected to multiple controllers, adapters, and expansion slots, such as input/output (I/O) interface 826, coupled to one of the multiple levels of bus 822. For example, input device 824 may include, for example, a microphone, a video capture device, an image scanning system, a keyboard, a mouse, or other input peripheral device, communicatively enabled on bus 822 via I/O interface 826 controlling inputs. In addition, for example, a display device 820 communicatively enabled on bus 822 via I/O interface 826 for controlling outputs may include, for example, one or more graphical display devices, audio speakers, and tactile detectable output interfaces, but may also include other output interfaces. In alternate embodiments of the present invention, additional or alternate input and output peripheral components may be added.

Those of ordinary skill in the art will appreciate that the hardware depicted in FIG. 8 may vary. Furthermore, those of ordinary skill in the art will appreciate that the depicted example is not meant to imply architectural limitations with respect to the present invention.

With reference now to FIG. 9, a high level logic flowchart depicts a process and program for designing variable width mesh wire widths in a multilayer ceramic module. As illustrated, FIG. 9 starts by receiving an initial multilayered ceramic package design with homogenous mesh wiring in the mesh planes at block 902. Next, block 904 depicts analyzing the multilayered ceramic package design to identify a selection of signal lines within the signal planes that are positioned in relation to other signal lines in other layers to introduce crosstalk among signals. Block 906 illustrates identifying a selection of mesh line segments within the mesh planes that shadow the selection of signal lines. Block 908 depicts increasing the widths of the selection of mesh line segments, while maintaining via clearances from via to mesh line segment for any of the selection of mesh line segments adjacent to one or more vias. Block 910 depicts calculating a metal loading percentage for each mesh plane after adjusting the widths of mesh line segments. Next, block 912 illustrates a determination whether any of the metal loading percentages exceed the metal loading requirements for the mesh planes. If any of the metal loading percentages exceed the metal loading requirements for the mesh planes, the process passes to block 914. Block 914 depicts adjusting the portions of the mesh wires set to the nominal base width to reduce the metal loading percentage of the plane to meet the metal loading requirements, such as by reducing the width of the nominal base width, removing mesh wiring, or adjusting the coarseness of mesh wiring. Thereafter, block 916 illustrates providing the resulting multilayered ceramic package design with mesh wiring set to varying widths to the fabrication system. Next, block 918 depicts fabricating multilayered ceramic package with mesh wiring set to varying widths, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A system of fabricating a multilayered ceramic package, comprising:
   at least one computer system operative to receive an initial multilayered ceramic package design, wherein the initial multilayered ceramic package design comprises a plurality of signal layers, each signal layer having one or more signal lines, at least one mesh layer adjacent at least one signal layer of the plurality of signal layers, wherein the at least one mesh layer comprises a mesh of a plurality of interconnected mesh line segments referenced by connection to either voltage or ground, wherein each of the plurality of mesh line segments are set to a same width, and at least one via running through the at least one signal layer and the at least one reference mesh layer, wherein each of the plurality of mesh line segments is positioned at least a via clearance minimum distance from the at least one via, a selection of signal lines from among the one or more signal lines positioned in relation to other signal layers from among the plurality of signal layers to cause crosstalk;
   the at least one computer system operative to maintain a first selection of mesh line segments of the plurality of mesh line segments at a first width and adjust a second selection of mesh line segments of the plurality of mesh line segments to a second width, wherein the second width is greater than the first width, wherein the second selection of mesh line segments of the second width are positioned to shadow a first portion of the selection of signal lines to contain crosstalk introduced by the first portion of the selection of signal lines, wherein each of the plurality of mesh line segments is positioned at least the via clearance minimum distance for the at least one via, wherein each of the second selection of mesh line segments is widened to the second width wider than the first width on both sides of the first selection of mesh line segments maintained at the first width, wherein none of the second selection of mesh line segments is adjacent to the at least one via, to generate a modified multilayered ceramic package design with mesh wiring of varying widths;
   the at least one computer system operative to remove at least one mesh line segment from among the first selection of mesh line segments in the initial multilayered ceramic package design, to generate the modified multilayered ceramic package design with mesh wiring of varying widths and at least one less mesh line segment than specified in the initial multilayered ceramic package design, to reduce the total metal fill for the plurality of mesh line segments to meet metal loading requirements for fabricating the at least one mesh layer; and
   the at least one computer system operative to control fabrication of the multilayered ceramic package based on the modified multilayered ceramic package design.

2. The system of claim 1, further comprising:
   the at least one computer system operative to select the distance of the second width such that the total metal fill for the plurality of mesh line segments meets metal loading requirements for fabricating the at least one mesh layer.

3. The system of claim 1, further comprising:
   the at least one computer system operative to adjust the coarseness of the plurality of mesh line segments to reduce the total metal fill for the plurality of mesh line segments to meet metal loading requirements for fabricating the at least one mesh layer.

4. The system of claim 1, further comprising:
   the at least one computer system operative to set a third selection of mesh line segments of the plurality of mesh line segments set to a third width, wherein the third selection of mesh line segments of the third width are positioned to shadow a second portion of the selection of the plurality of signal lines to contain crosstalk introduced by the second portion of the selection of the plurality of signal lines, wherein only one side of each line segment among the third selection of mesh line segments is widened on a side opposite the at least one via, wherein each of the third selection of mesh line segments is adjacent to the at least one via wherein only one side of each line segment among the third selection of mesh line segments is widened to a width wider than the first width only on a side opposite the at least one via, to generate the modified multilayered ceramic package design with mesh wiring of varying widths.

5. The system of claim 1, further comprising:
the at least one computer system operative to identify the selection of signal lines with signals likely to introduce cross talk with signals of other signal lines on other planes from among the plurality of signal planes; and
the at least one computer system operative to identify the second selection of mesh line segments comprising at least one mesh line segment in the at least one mesh plane positioned to shadow the selection of signal lines.

6. A computer program product for fabricating a multilayered ceramic package, the computer program product comprising a computer readable storage medium having program instructions embodied therewith, the program instructions executable by a computer to cause the computer to:
receive an initial multilayered ceramic package design, wherein the initial multilayered ceramic package design comprises a plurality of signal layers, each signal layer having one or more signal lines, at least one mesh layer adjacent at least one signal layer of the plurality of signal layers, wherein the at least one mesh layer comprises a mesh of a plurality of interconnected mesh line segments referenced by connection to either voltage or ground, wherein each of the plurality of mesh line segments are set to a same width, and at least one via running through the at least one signal layer and the at least one reference mesh layer, wherein each of the plurality of mesh line segments is positioned at least a via clearance minimum distance from the at least one via, a selection of signal lines from among the one or more signal lines positioned in relation to other signal layers from among the plurality of signal layers to cause crosstalk;
maintain a first selection of mesh line segments of the plurality of mesh line segments at a first width and adjust a second selection of mesh line segments of the plurality of mesh line segments to a second width, wherein the second width is greater than the first width, wherein the second selection of mesh line segments of the second width are positioned to shadow a first portion of the selection of signal lines to contain crosstalk introduced by the first portion of the selection of signal lines, wherein each of the plurality of mesh line segments is positioned at least the via clearance minimum distance for the at least one via, wherein each of the second selection of mesh line segments is widened to the second width wider than the first width on both sides of the first selection of mesh line segments maintained at the first width, wherein none of the second selection of mesh line segments is adjacent to the at least one via, to generate a modified multilayered ceramic package design with mesh wiring of varying widths;
remove at least one mesh line segment from among the first selection of mesh line segments in the initial multilayered ceramic package design, to generate the modified multilayered ceramic package design with mesh wiring of varying widths and at least one less mesh line segment than specified in the initial multilayered ceramic package design, to reduce the total metal fill for the plurality of mesh line segments to meet metal loading requirements for fabricating the at least one mesh layer; and
fabricate the multilayered ceramic package based on the modified multilayered ceramic package design.

7. The computer program product of claim 6, further comprising the program instructions executable by a computer to cause the computer to:
select the distance of the second width such that the total metal fill for the plurality of mesh line segments meets metal loading requirements for fabricating the at least one mesh layer.

8. The computer program product of claim 6, further comprising the program instructions executable by a computer to cause the computer to:
adjust the coarseness of the plurality of mesh line segments to reduce the total metal fill for the plurality of mesh line segments to meet metal loading requirements for fabricating the at least one mesh layer.

9. The computer program product of claim 6, further comprising the program instructions executable by a computer to cause the computer to:
set a third selection of mesh line segments of the plurality of mesh line segments set to a third width, wherein the third selection of mesh line segments of the third width are positioned to shadow a second portion of the selection of the plurality of signal lines to contain crosstalk introduced by the second portion of the selection of the plurality of signal lines, wherein only one side of each line segment among the third selection of mesh line segments is widened on a side opposite the at least one via, wherein each of the third selection of mesh line segments is adjacent to the at least one via wherein only one side of each line segment among the third selection of mesh line segments is widened to a width wider than the first width only on a side opposite the at least one via, to generate the modified multilayered ceramic package design with mesh wiring of varying widths.

10. The computer program product of claim 6, further comprising the program instructions executable by a computer to cause the computer to:
identify the selection of signal lines with signals likely to introduce cross talk with signals of other signal lines on other planes from among the plurality of signal planes; and
identify the second selection of mesh line segments comprising at least one mesh line segment in the at least one mesh plane positioned to shadow the selection of signal lines.

* * * * *